United States Patent
Huang et al.

(10) Patent No.: US 8,788,730 B2
(45) Date of Patent: Jul. 22, 2014

(54) METHOD FOR SENDING A KEYCODE OF A NON-KEYBOARD APPARATUS

(75) Inventors: Cheng-Hung Huang, Hsinchu (TW); Wei-Chih Yeh, Taipei (TW); Bo-Wen Cheng, Hsinchu (TW)

(73) Assignee: Tenx Technology Inc., New Taipei (TW)

( * ) Notice: Subject to any disclaimer, the term of this patent is extended or adjusted under 35 U.S.C. 154(b) by 564 days.

(21) Appl. No.: 13/181,022

(22) Filed: Jul. 12, 2011

(65) Prior Publication Data
US 2012/0194360 A1  Aug. 2, 2012

(30) Foreign Application Priority Data
Jan. 31, 2011  (TW) .............................. 100103560 A

(51) Int. Cl.
  *G06F 3/023*  (2006.01)
  *G06F 13/00*  (2006.01)

(52) U.S. Cl.
  USPC ............ 710/73; 710/2; 710/5; 710/8; 710/15; 710/72

(58) Field of Classification Search
None
See application file for complete search history.

(56) References Cited

U.S. PATENT DOCUMENTS

| 2004/0150625 A1 | 8/2004 | Shih et al. |
| 2009/0187687 A1 | 7/2009 | Hulbert et al. |
| 2010/0100652 A1* | 4/2010 | Lin et al. ......................... 710/73 |

* cited by examiner

*Primary Examiner* — Scott Sun
(74) *Attorney, Agent, or Firm* — Li & Cai Intellectual Property (USA) Office

(57) ABSTRACT

A method for sending a keycode of a non-keyboard apparatus is provided and includes the following steps. The non-keyboard apparatus determines the connection status between itself and a computer by the time required for device enumeration. Then, according to a value generated from device enumeration, the non-keyboard apparatus identifies the kind of operating system running on the computer. The non-keyboard apparatus sends to the computer a keycode corresponding to the Num Lock key and/or a keycode corresponding to the Caps Lock key such that a sending time and a feedback time are obtained. A parameter related to the efficiency of the computer is then calculated based.

15 Claims, 11 Drawing Sheets

METHOD FOR SENDING A KEYCODE OF A NON-KEYBOARD APPARATUS

BACKGROUND OF THE INVENTION

1. Technical Field

The present invention relates to an electronic digital data processing technique and, more particularly, to an input technique for converting the data to be processed into a computer-processable format.

2. Description of Related Art

Computers have been an indispensable tool for the human kind in the 21$^{st}$ century. In order for users to operate computers with ease, various man-machine interface devices have emerged. In particular, the Universal Serial Bus (USB)—which features hot-pluggability and Plug and Play—was developed not only as a bridge between a computer and a keyboard, but also to accelerate data transfer therebetween. A keyboard supporting the USB interface is generally referred to a USB keyboard.

A conventional USB keyboard has approximately 104 keys or more. Although the functions of keys can be integrated, the increasing number of function keys has brought about more and more complex functions that hinder, rather than facilitate, user operation.

Besides, as operating systems (e.g., Windows and MAC) vary in terms of function design, so do the applicable keycodes. Therefore, a user must choose a keyboard whose keycodes correspond to those of the operating system in use. As the keycodes are factory-set at shipment and not to be altered by users, keyboards designed for a certain operating system cannot be used in a different operating system. This, without doubt, does not meet the current trend of energy saving and carbon reduction.

Moreover, it is well known that the execution time of a computer depends on computer efficiency, and yet the conventional USB keyboard is unable to identify the execution state of the computer to which the keyboard is connected, let alone making automatic and corresponding adjustment in transfer rate. As a result, the conventional USB keyboard is subject to errors such as invalid keycode input and missing keycodes.

In view of the above, the industry has made improvements to overcome the drawbacks of the conventional USB keyboard and produced the following results.

US Published Patent Application No. 20090187687 discloses a portable USB device, wherein a keycode sequence automates direct access to content and/or the initiation of a task or other processes. US Published Patent Application No. 20040150625, on the other hand, teaches a virtual keyboard and mouse control device, wherein signals are output to a server after signal transformation.

BRIEF SUMMARY OF THE INVENTION

To overcome the aforesaid drawbacks of the prior art, the present invention provides a method for sending a keycode of a non-keyboard apparatus, wherein the method includes the following steps:

(a) The non-keyboard apparatus is connected to a computer so that device enumeration is carried out to generate enumeration information. The enumeration information is recorded by the non-keyboard apparatus and includes an enumeration value.

(b) Based on the enumeration value, the kind of operating system used by the computer is automatically identified and is recorded by the non-keyboard apparatus.

(c) The kind of operating system is read in order to determine a second keycode that matches the kind of operating system.

Therefore, the primary object of the present invention is to provide the foregoing method for sending a keycode of a non-keyboard apparatus, wherein the method includes identifying the kind of operating system in use by the computer and then sending keycodes corresponding to the key functions defined by the operating system in use, so as for the method to be applicable to computers using different operating systems.

Another object of the present invention is to provide the foregoing method for sending a keycode of a non-keyboard apparatus, wherein the keycodes of the computer are pre-stored in the non-keyboard apparatus and can be modified or updated according to manufacturers' or users' needs. Through proper setting, the non-keyboard apparatus can directly send continuous or non-continuous keycodes to the computer, thus providing a customized, user-friendly mode of operation.

The present invention also provides a method for sending a keycode of a non-keyboard apparatus, wherein the method includes the following steps:

(a) The non-keyboard apparatus is connected to a computer so that device enumeration is carried out to generate enumeration information. The enumeration information is recorded by the non-keyboard apparatus.

(b) Information related to the kind of operating system in use is set, and the set information is recorded by the non-keyboard apparatus.

(c) The non-keyboard apparatus sends a first keycode to the computer at a sending time. The sending time is recorded by the non-keyboard apparatus.

(d) The computer feeds back to the non-keyboard apparatus at a feedback time that a first key corresponding to the first keycode is enabled. The feedback time is recorded by the non-keyboard apparatus.

(e) The sending time and the feedback time are read, and the time elapsed between the sending time and the feedback time is calculated to produce a computer efficiency parameter, which is recorded by the non-keyboard apparatus.

(f) The kind of operating system is read so as to determine a second keycode that matches the kind of operating system, wherein the second keycode includes a plurality of key characters. In addition, the computer efficiency parameter is read so as to determine the time interval at which the key characters are to be sent.

Hence, it is another major object of the present invention to provide the foregoing method for sending a keycode of a non-keyboard apparatus, wherein the method automatically identifies the operating efficiency of the computer and determines accordingly the time interval at which the key characters are to be sent. Thus, transfer errors which may otherwise result from variation in computer operating efficiency are prevented.

It is another object of the present invention to provide the foregoing method for sending a keycode of a non-keyboard apparatus, wherein the keycodes of the computer are pre-stored in the non-keyboard apparatus and can be modified or updated according to manufacturers' or users' needs. Through proper setting, the non-keyboard apparatus can send continuous or non-continuous keycodes directly to the computer, thus providing a customized, user-friendly mode of operation.

BRIEF DESCRIPTION OF THE SEVERAL VIEWS OF THE DRAWINGS

A detailed description of further features and advantages of the present invention is given below with reference to the accompanying drawings, in which.

DETAILED DESCRIPTION OF THE INVENTION

The present invention discloses a method for sending a keycode of a non-keyboard apparatus. As the principles of the Universal Serial Bus (USB) and the related techniques that are used in the present invention are well known to a person of ordinary skill in the art, a detailed description of such principles and techniques is omitted herein. Besides, it should be understood that the drawings referred to in the following description are not necessarily drawn to scale, for they are intended to demonstrate the technical features of the present invention only schematically.

Figure 1A:
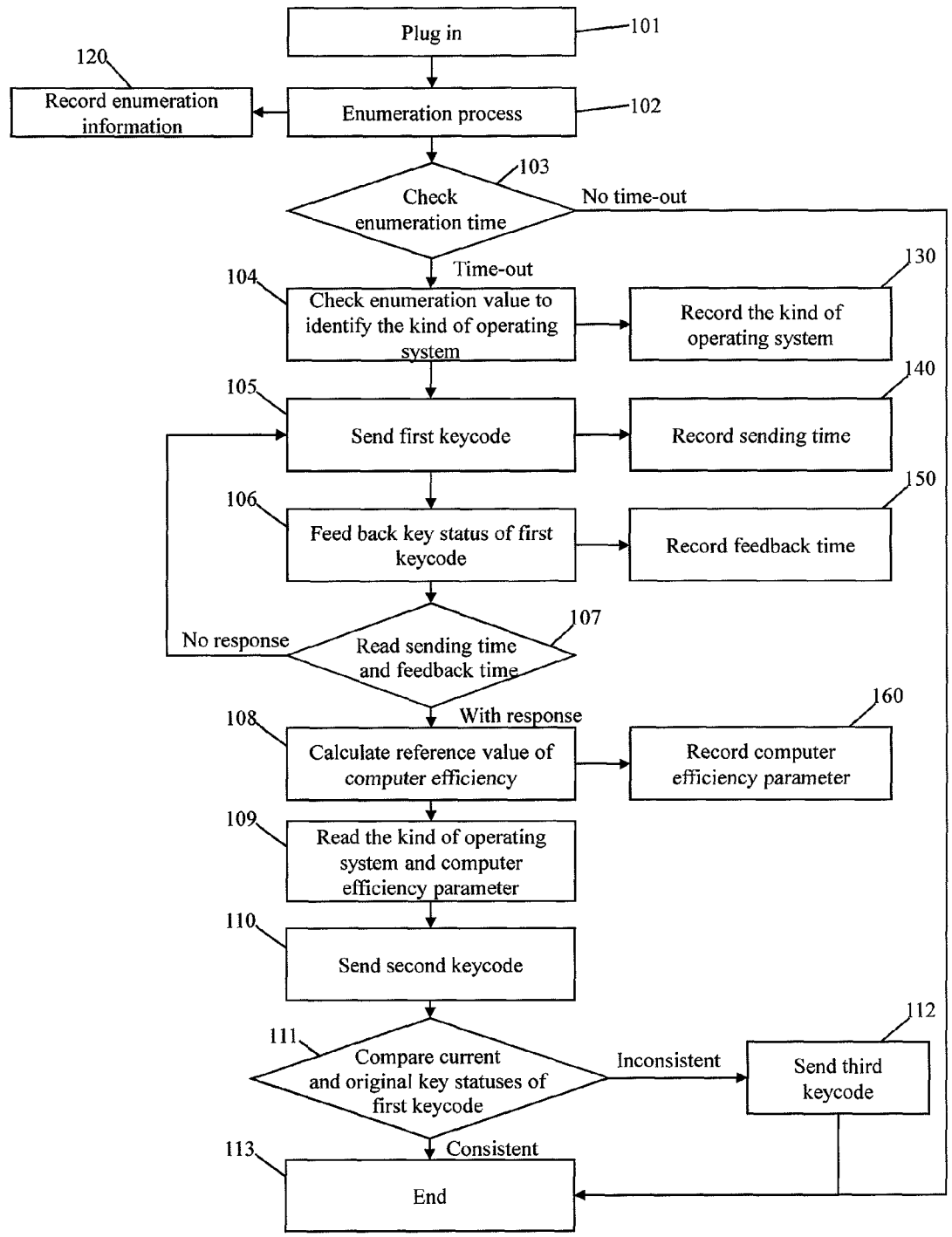
FIG. 1A is the flowchart of a method for sending a keycode of a non-keyboard apparatus according to the first preferred embodiment of the present invention.
Figure 1B:
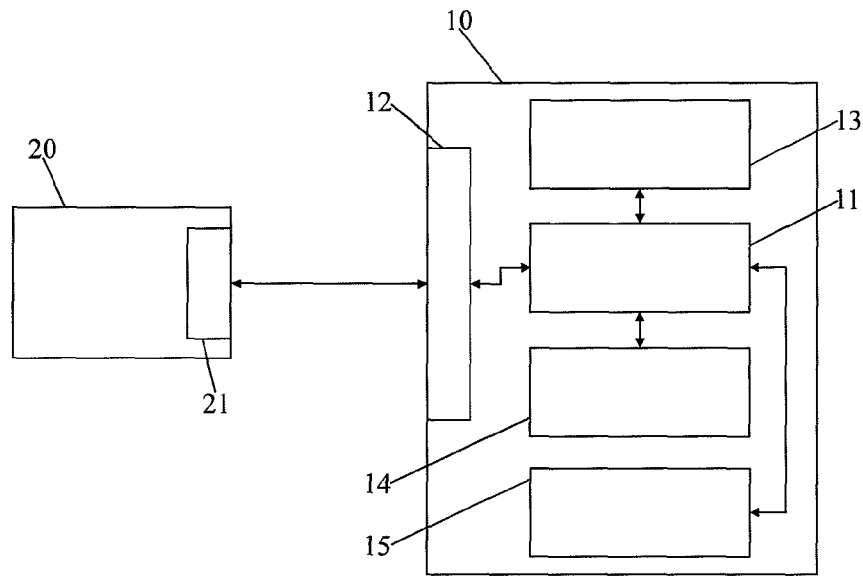
FIG. 1B is a block diagram showing a non-keyboard apparatus and a computer connected therewith that employ the method of the present invention for sending a keycode of a non-keyboard apparatus.

Please refer to FIG. 1A for the flowchart of a method for sending a keycode of a non-keyboard apparatus according the first preferred embodiment of the present invention, wherein the keycode is sent from the non-keyboard apparatus to a computer. Reference is also made to FIG. 1B, which illustrates a non-keyboard apparatus 10 and a computer 20 connected therewith that employ the method disclosed in the first preferred embodiment. The non-keyboard apparatus 10 is electrically connected to the computer 20. The non-keyboard apparatus 10 includes an interface microcontroller 11, a USB interface 12, a key control interface 13, a first storage unit 14, and a second storage unit 15.

The interface microcontroller 11 is electrically connected to a serial bus interface 21 of the computer 20 via the USB interface 12. The key control interface 13 is electrically connected to the interface microcontroller 11.

The first storage unit 14 is electrically connected to the interface microcontroller 11. The first storage unit 14 is a read-only memory (ROM) or a random access memory (RAM) and is configured for storing default parameters. Whenever the non-keyboard apparatus 10 is reset, the interface microcontroller 11 retrieves the default parameters from the first storage unit 14.

The second storage unit 15, which is also electrically connected to the interface microcontroller 11, is an electrically erasable programmable read-only memory (EEPROM) or a flash memory and is configured for storing an original recorded enumeration time, an enumeration time, an enumeration value, an original key status of a first keycode, the kind of an operating system, a sending time, a feedback time, a computer efficiency parameter, and like edit parameters. When the non-keyboard apparatus 10 is electrically connected to the computer 20, the interface microcontroller 11 reads the edit parameters stored in the second storage unit 15. It should be noted that the edit parameters stored in the second storage unit 15 can be modified or updated by manufacturers or users.

Figure 1C:
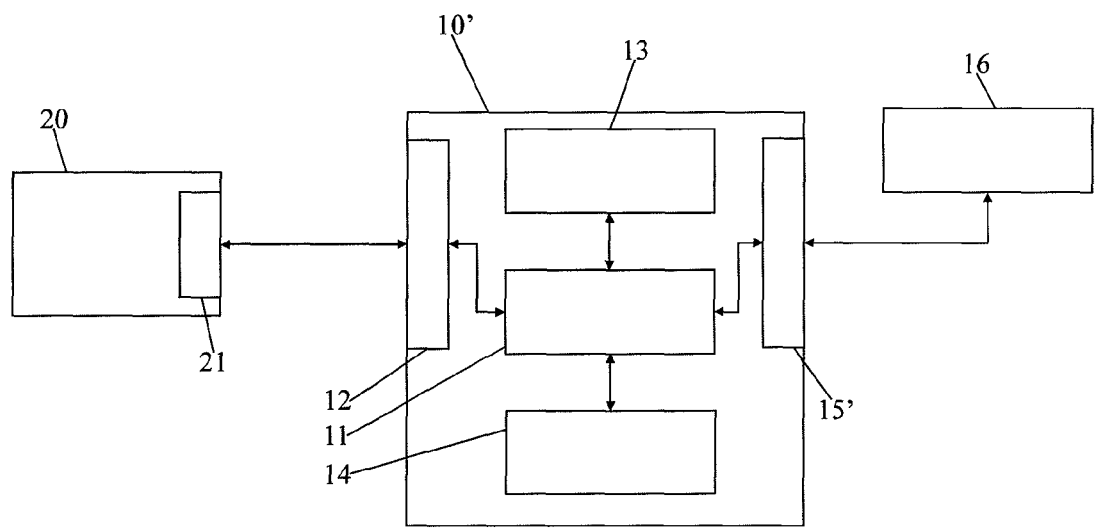
FIG. 1C is a block diagram showing the computer depicted in FIG. 1B and another non-keyboard apparatus connected therewith that employ the method of the present invention for sending a keycode of a non-keyboard apparatus.

FIG. 1C shows the computer 20 and another non-keyboard apparatus 10' connected thereto that employ the method disclosed in the first preferred embodiment of the present invention. The non-keyboard apparatus 10' is electrically connected to the computer 20 and has substantially the same configuration as the non-keyboard apparatus 10. In addition to the interface microcontroller 11, the USB interface 12, the key control interface 13, and the first storage unit 14, the non-keyboard apparatus 10' further includes a second storage unit interface 15' and a second storage unit 16.

As shown in FIG. 1C, the interface microcontroller 11 is electrically connected to the serial bus interface 21 of the computer 20 via the USB interface 12. The key control interface 13 is electrically connected to the interface microcontroller 11, and so is the first storage unit 14. The first storage unit 14 is a ROM or a RAM and is configured to store default parameters. Whenever the non-keyboard apparatus 10' is reset, the interface microcontroller 11 reads the default parameters stored in the first storage unit 14. The second storage unit interface 15' is electrically connected to the interface microcontroller 11. The second storage unit 16 is an EEPROM or a flash memory and is configured to store an original recorded enumeration time, an enumeration time, an enumeration value, an original key status of a first keycode, the kind of an operating system, a sending time, a feedback time, a computer efficiency parameter, and like edit parameters. When the non-keyboard apparatus 10' is electrically connected to the computer 20, the interface microcontroller 11 retrieves the edit parameters from the second storage unit 16. The edit parameters in the second storage unit 16 can also be modified or updated by manufacturers or users.

The second storage unit 15 of the non-keyboard apparatus 10 and the second storage unit 16 of the non-keyboard apparatus 10' are different in that the former is built in the non-keyboard apparatus 10 whereas the latter is externally connected to the non-keyboard apparatus 10'. For example, the second storage unit 15 can be an on-board memory (EEPROM or flash memory) soldered to a circuit board, and the second storage unit 16 can be an SD card, a miniSD card, a micro SD card, a Compact Flash (CF) card, a Memory Stick (MS), a MultiMedia card (MMC), a PCMCIA card, a Secure Digital (SD/SDHC/SDXC) card, a SmartMedia card (SM/SMC), or an xD Picture Card (XDPC). Manufacturers or users may choose the built-in second storage units 15 or the external second storage unit 16 according to practical needs and expand the memory capacity as appropriate.

Referring back to FIG. 1A, the method for sending a keycode of a non-keyboard apparatus according to the first preferred embodiment of the present invention includes the following steps:

Step 101: The non-keyboard apparatus 10 or 10' is electrically connected to the computer 20. Go on to step 102.

Step 102: A device enumeration process is performed between the non-keyboard apparatus 10 or 10' and the computer 20 to generate enumeration information. Then, move on to steps 120 and 103. The enumeration information includes: a) an enumeration time defined as the time elapsed between the start and the end of the device enumeration process; b) an enumeration value defined as a value generated from the device enumeration process, or more particularly, from parameters involved in the device enumeration process; and c) the original key status of a first keycode. The device enumeration process on the part of the non-keyboard apparatus 10 or 10' is carried out by the interface microcontroller 11 after the USB interface 12 of the non-keyboard apparatus 10 or 10' is electrically connected to the serial bus interface 21 of the computer 20.

Step 120: The enumeration information generated in step 102 is recorded in the second storage unit 15 or 16 of the non-keyboard apparatus 10 or 10'. More specifically, the recorded enumeration information is stored in the second storage unit 15 of the non-keyboard apparatus 10 or the second storage unit 16 of the non-keyboard apparatus 10'. If the device enumeration process is performed upon first-time connection between the non-keyboard apparatus 10 or 10' and the computer 20, there is no previously stored enumeration information in the non-keyboard apparatus 10 or 10'. In that case, the enumeration time in the enumeration information is recorded and stored as the original recorded enumeration time.

Step 103: The interface microcontroller 11 retrieves from the second storage unit 15 or 16 of the non-keyboard apparatus 10 or 10' the enumeration time in the enumeration information and the original recorded enumeration time and determines whether the enumeration time is greater than the original recorded enumeration time. If the enumeration time is greater than the original recorded enumeration time, which defines a time-out state, the interface microcontroller 11 determines that the non-keyboard apparatus 10 or 10' is connected to the computer 20 for the first time, and then step 104 is executed. If the enumeration time is not greater than (i.e., being less than or equal to) the original recorded enumeration time, which means no time-out, the interface microcontroller 11 determines that the non-keyboard apparatus 10 or 10' is not connected to the computer 20 for the first time, and then step 113 is executed to complete connection between the non-keyboard apparatus 10 or 10' and the computer 20.

Step 104: The interface microcontroller 11 retrieves the enumeration value in the enumeration information from the second storage unit 15 or 16 of the non-keyboard apparatus 10 or 10' and compares the obtained enumeration value with the default parameters stored in the first storage unit 14, so as to identify the kind of the operating system running on the computer 20. Then, go on to steps 130 and 105. The operating system may be of various kinds, such as MAC and Windows.

Step 130: The interface microcontroller 11 records and stores the kind of operating system obtained from step 104 into the second storage unit 15 or 16 of the non-keyboard apparatus 10 or 10'.

Step 105: The non-keyboard apparatus 10 or 10' sends a first keycode to the computer 20 at a sending time Ts such as 10:00:00.000 (hour:minute:second.millisecond). Then, go on to steps 140 and 106. The first keycode is a keycode corresponding to the Num Lock key, a keycode corresponding to the Caps Lock key, or a keycode corresponding to both keys.

Step 140: The interface microcontroller 11 records the sending time Ts of step 105 into the second storage unit 15 or 16 of the non-keyboard apparatus 10 or 10'.

Step 106: The computer 20 feeds back to the non-keyboard apparatus 10 or 10', at a feedback time Tf such as 10:00:00.050 (hour:minute:second.millisecond), that a first key corresponding to the first keycode is in an enabled status. Then, move on to steps 150 and 107. The first key is the Num Lock key, the Caps Lock key, or both the Num Lock key and the Caps Lock key.

Step 150: The interface microcontroller 11 records the feedback time Tf of step 106 into the second storage unit 15 or 16 of the non-keyboard apparatus 10 or 10'.

Step 107: The sending time Ts recorded in step 140 and the feedback time Tf recorded in step 150 are read from the second storage unit 15 or 16 of the non-keyboard apparatus 10 or 10'. If the sending time Ts and the feedback time Tf cannot be read (i.e., there is no response from the second storage unit 15 or 16), go back to step 105. If the sending time Ts and the feedback time Tf are successfully read (i.e., the second storage unit 15 or 16 responds), go on to step 108.

Step 108: The time elapsed between the feedback time Tf and the sending time Ts is calculated to produce a computer efficiency parameter P, wherein the computer efficiency parameter P satisfies the relationship of: $P \geq (Tf-Ts)/2$. Following that, steps 160 and 109 are performed.

Step 160: The computer efficiency parameter P obtained from step 108 is recorded in the second storage unit 15 or 16 of the non-keyboard apparatus 10 or 10'.

Step 109: The interface microcontroller 11 reads the kind of operating system stored in step 130 from the second storage unit 15 or 16 of the non-keyboard apparatus 10 or 10', so as to determine a second keycode that matches the kind of operating system. The second keycode includes a plurality of key characters, or more particularly, includes a string of key characters that correspond to a plurality of keys. For example, in order for the Microsoft® Internet Explorer browser to open the web page WWW.USPTO.GOV, the second keycode includes keycodes corresponding to all the key characters in the string "WWW.USPTO.GOV", namely "W", "W", "W", ".", "U", "S", "P", "T", "O", ".", "G", "O", and "V". In addition, the interface microcontroller 11 reads the computer efficiency parameter P recorded in step 160 from the second storage unit 15 or 16 of the non-keyboard apparatus 10 or 10', so as to determine the time interval Ti at which keycodes corresponding to the key characters in the second keycode will be sent. Afterward, step 110 is executed. The second keycode is an ASCII (American Standard Code for Information Interchange) code.

Step 110: The non-keyboard apparatus 10 or 10' sends the second keycode to the computer 20 according to the time interval Ti based on the computer efficiency parameter P.

Step 111: The non-keyboard apparatus 10 or 10' determines whether the current key status of the first key is consistent with the original key status of the first key as recorded in the second storage unit 15 or 16 in step 120. If yes, go on to step 113 to complete connection between the non-keyboard apparatus 10 or 10' and the computer 20; otherwise, go to step 112.

Step 112: The non-keyboard apparatus 10 or 10' sends a third keycode to the computer 20, and then step 113 is executed. The third keycode is a keycode for disabling the Num Lock key, a keycode for disabling the Caps Lock key, or a keycode for disabling both keys, and is intended to restore the number keys or capital letter keys of a keyboard to the original key status detected in step 102.

Step 113: The process ends, and connection between the non-keyboard apparatus 10 or 10' and the computer 20 is thus completed.

It can be known from the above that, according to the present invention, the keycodes of a computer are stored in a non-keyboard apparatus and can be modified or updated by manufacturers or users as needed. Through proper setting, the non-keyboard apparatus can send continuous or non-continuous keycodes directly to the computer, thus not only providing a customized, user-friendly mode of operation, but also solving the problems resulting from the conventional USB keyboard's not allowing keycode modification or update.

The method for sending a keycode of a non-keyboard apparatus as disclosed in the first preferred embodiment may have many variations, some of which are described hereinafter as the second to the tenth preferred embodiments of the present invention.

Figure 2:
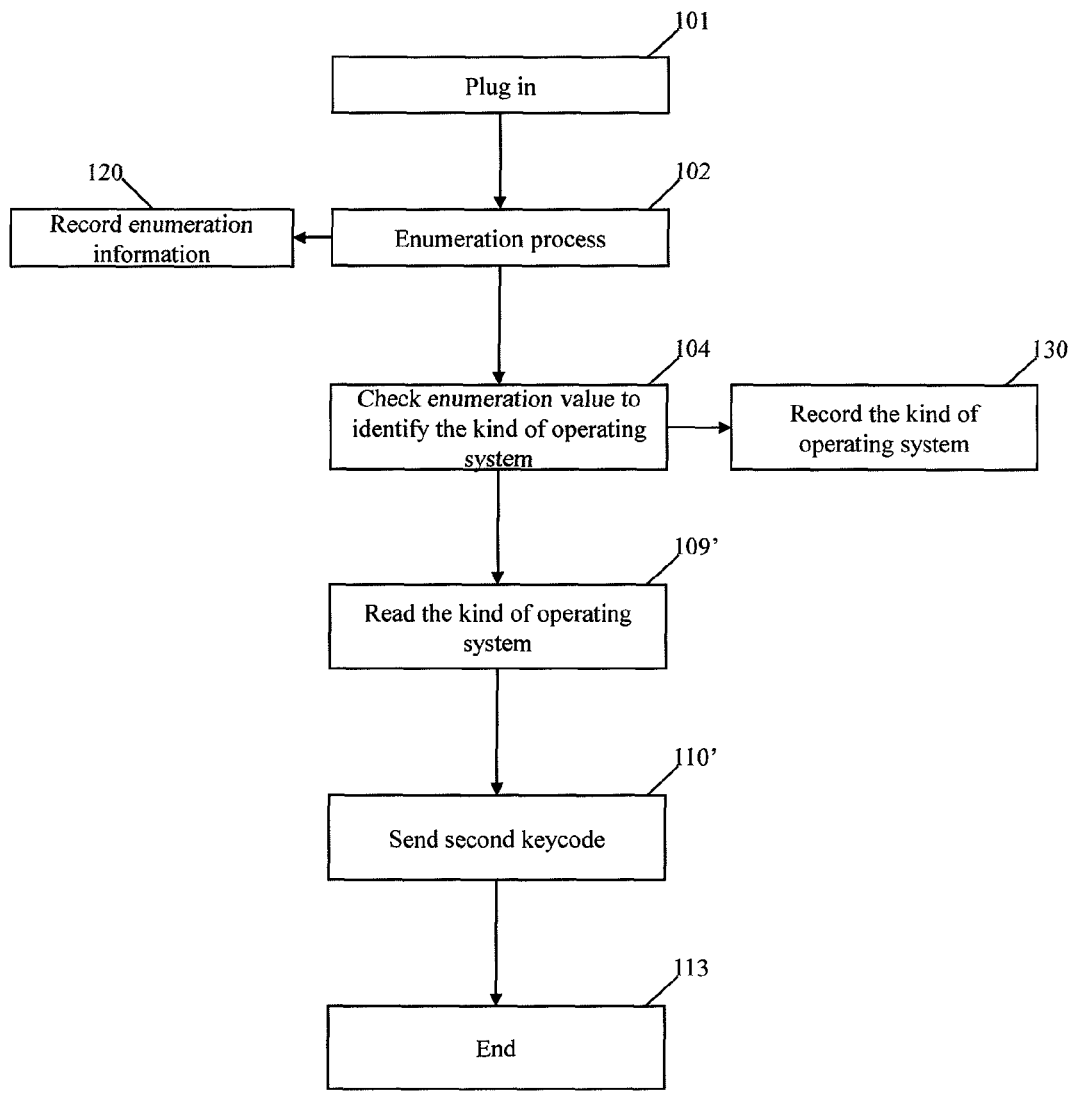
FIG. 2 is the flowchart of a method for sending a keycode of a non-keyboard apparatus according to the second preferred embodiment of the present invention.

The second preferred embodiment of the present invention is illustrated in FIG. 2, which shows another flowchart of the disclosed method for sending a keycode of a non-keyboard apparatus. The second preferred embodiment is different from the first in that the method in the second preferred embodiment only identifies the kind of operating system but does not perform such steps as calculating the reference value of computer efficiency and determining the key status of the first key. The configuration of, and connections between, the components of the non-keyboard apparatus 10 or 10' and of the computer 20 in the second preferred embodiment are substantially the same as those in the first preferred embodiment as shown in FIG. 1B and FIG. 1C.

According to the second preferred embodiment, the method for sending a keycode of a non-keyboard apparatus includes the following steps:

Step 101: The non-keyboard apparatus 10 or 10' is electrically connected to the computer 20. Move on to step 102.

Step 102: A device enumeration process is performed between the non-keyboard apparatus 10 or 10' and the computer 20 to generate enumeration information. Then, go on to step 104 and 120. The enumeration information includes: a) an enumeration time defined as the time elapsed between the start and the end of the device enumeration process; b) an enumeration value defined as a value generated from the device enumeration process, or more particularly, from parameters involved in the device enumeration process; and c) the original key status of a first keycode. The device enumeration process on the part of the non-keyboard apparatus 10 or 10' is carried out by the interface microcontroller 11 after the USB interface 12 of the non-keyboard apparatus 10 or 10' is electrically connected to the serial bus interface 21 of the computer 20.

Step 120: The enumeration information generated in step 102 is recorded in the second storage unit 15 or 16 of the non-keyboard apparatus 10 or 10'. More specifically, the recorded enumeration information is stored in the second storage unit 15 of the non-keyboard apparatus 10 or the second storage unit 16 of the non-keyboard apparatus 10'. If the device enumeration process is performed upon first-time connection between the non-keyboard apparatus 10 or 10' and the computer 20, there is no previously stored enumeration information in the non-keyboard apparatus 10 or 10'. In that case, the enumeration time in the enumeration information is recorded and stored as the original recorded enumeration time.

Step 104: The interface microcontroller 11 retrieves the enumeration value in the enumeration information from the second storage unit 15 or 16 of the non-keyboard apparatus 10 or 10' and compares the obtained enumeration value with the default parameters stored in the first storage unit 14, so as to identify the kind of the operating system used by the computer 20. Then, go to steps 130 and 109'. The operating system may be of various kinds, such as MAC and Windows.

Step 130: The interface microcontroller 11 records and stores the kind of operating system obtained from step 104 into the second storage unit 15 or 16 of the non-keyboard apparatus 10 or 10'.

Step 109': The interface microcontroller 11 reads the kind of operating system stored in step 130 from the second storage unit 15 or 16 of the non-keyboard apparatus 10 or 10', so as to determine a second keycode that matches the kind of operating system. The second keycode includes a plurality of key characters, or more particularly, includes a string of key characters that correspond to a plurality of keys. For example, in order for the Microsoft® Internet Explorer browser to open the web page WWW.USPTO.GOV, the second keycode includes keycodes corresponding to all the key characters in the string "WWW.USPTO.GOV", namely "W", "W", "W", ".", "U", "S", "P", "T", "O", ".", "G", "O", and "V". Then, move on to step 110'. The second keycode is an ASCII code. Step 109' in the second preferred embodiment is different from step 109 in the first preferred embodiment in that step 109' only reads the kind of operating system while step 109 reads the computer efficiency parameter P as well as the kind of operating system.

Step 110': The non-keyboard apparatus 10 or 10' sends the second keycode to the computer 20, and then step 113 is executed. Step 110' in the second preferred embodiment is different from step 110 in the first preferred embodiment in that step 110' only sends the second keycode to the computer 20 whereas step 110 sends the second keycode to the computer 20 according to the time interval Ti.

Step 113: The process ends, thereby completing connection between the non-keyboard apparatus 10 or 10' and the computer 20.

Figure 3:
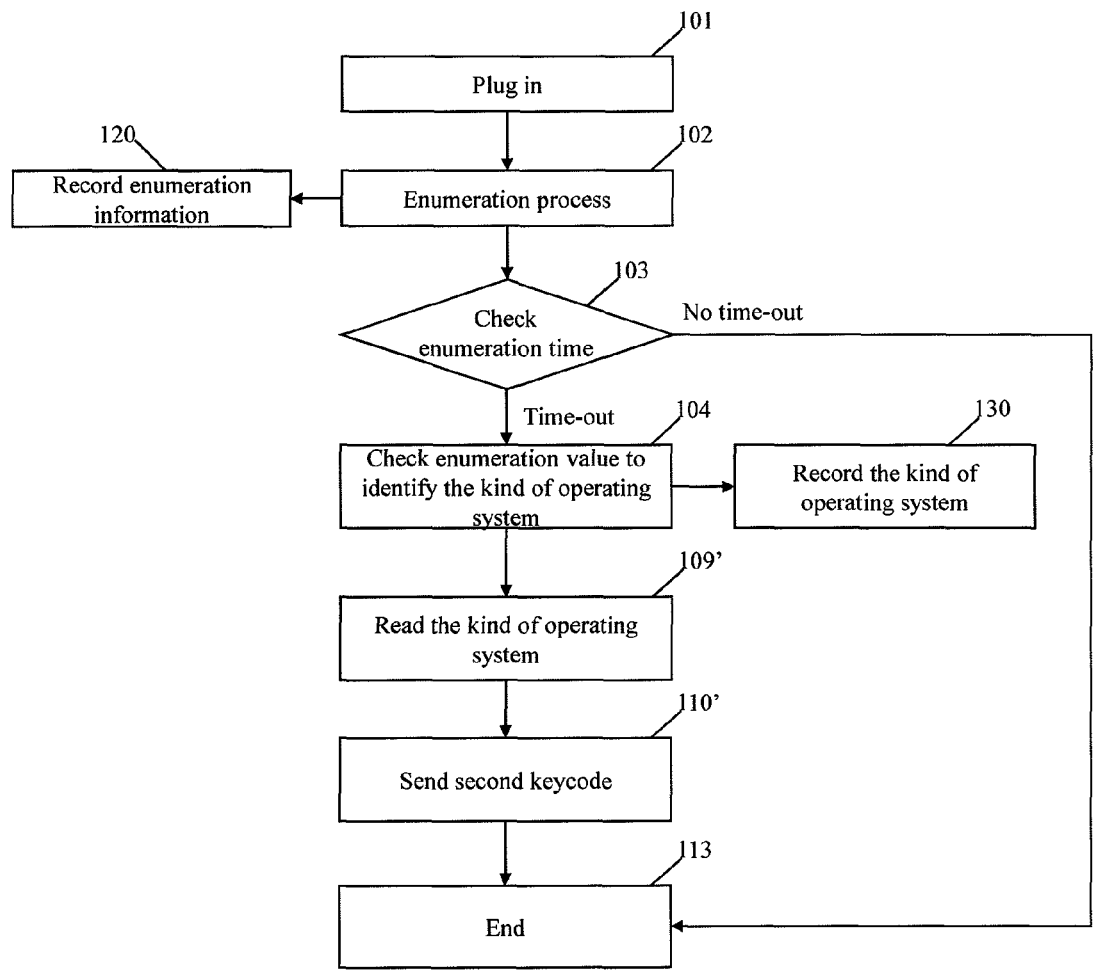
FIG. 3 is the flowchart of a method for sending a keycode of a non-keyboard apparatus according to the third preferred embodiment of the present invention.

Reference is now made to FIG. 3 for the flowchart of a method for sending a keycode of a non-keyboard apparatus according to the third preferred embodiment of the present invention. The third preferred embodiment is different from the second preferred embodiment in that the former further checks the enumeration time. More specifically, step 103 in the first preferred embodiment is performed between steps 102 and 104 in the third preferred embodiment so as for the interface microcontroller 11 to determine if the non-keyboard apparatus 10 or 10' is connected to the computer 20 for the first time. The configuration of, and connections between, the components of the non-keyboard apparatus 10 or 10' and of the computer 20 in the third preferred embodiment are substantially the same as those in the first preferred embodiment as shown in FIG. 1B and FIG. 1C.

In step 103, the interface microcontroller 11 retrieves from the second storage unit 15 or 16 of the non-keyboard apparatus 10 or 10' the enumeration time in the enumeration information and the original recorded enumeration time and determines whether the enumeration time is greater than the original recorded enumeration time. If the enumeration time is greater than the original recorded enumeration time, which defines a time-out state, the interface microcontroller 11 determines that the non-keyboard apparatus 10 or 10' is connected to the computer 20 for the first time, and then step 104 is executed. If the enumeration time is not greater than (i.e., being less than or equal to) the original recorded enumeration time, which means no time-out, the interface microcontroller 11 determines that the non-keyboard apparatus 10 or 10' is not connected to the computer 20 for the first time, and then step 113 is executed to complete connection between the non-keyboard apparatus 10 or 10' and the computer 20.

Figure 4:
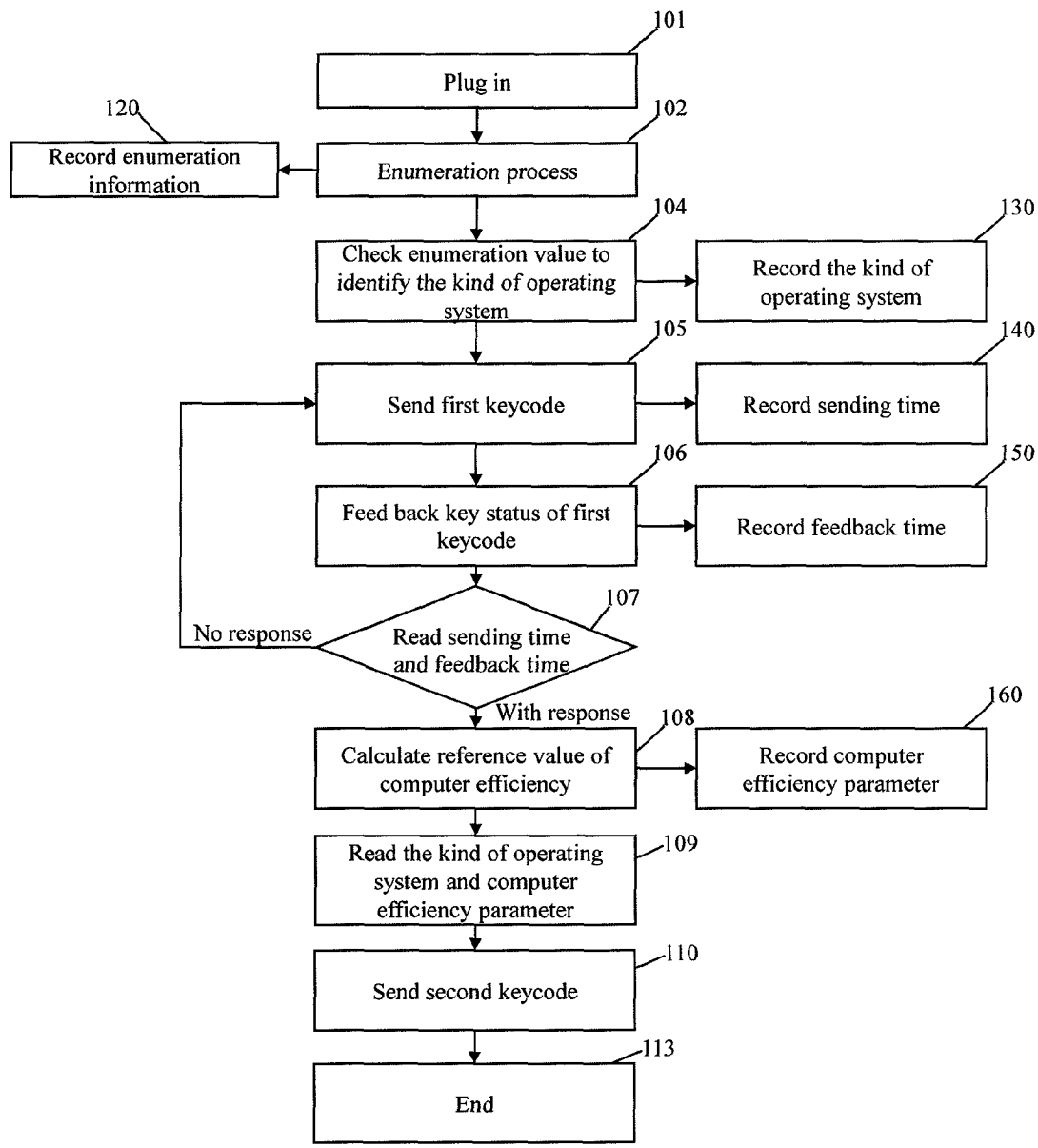
FIG. 4 is the flowchart of a method for sending a keycode of a non-keyboard apparatus according to the fourth preferred embodiment of the present invention.

The fourth preferred embodiment of the present invention is illustrated in FIG. 4, which shows another flowchart of the disclosed method for sending a keycode of a non-keyboard apparatus. The fourth and the second preferred embodiments are different in that the fourth preferred embodiment includes the steps related to determining the computer efficiency parameter. More specifically, steps 105 to 108, as well as steps 130, 140, 150, and 160 for recording the related parameters, in the first preferred embodiment are carried out between steps 104 and 113 of the fourth preferred embodiment, so as for the interface microcontroller 11 to calculate the computer efficiency parameter P and thereby determine the time interval Ti at which keycodes corresponding to the key characters in the second keycode are to be sent. The configuration of, and connections between, the components of the non-keyboard apparatus 10 or 10' and of the computer 20 in the fourth preferred embodiment are substantially the same as those in the first preferred embodiment as shown in FIG. 1B and FIG. 1C. Steps 105 to 110 and 140 to 160 in the fourth preferred embodiment are described as follows.

Step 105: The non-keyboard apparatus 10 or 10' sends a first keycode to the computer 20 at a sending time Ts such as 10:00:00.000 (hour:minute:second.millisecond). Then, go on to steps 140 and 106. The first keycode is a keycode corresponding to the Num Lock key and/or a keycode corresponding to the Caps Lock key.

Step 140: The interface microcontroller 11 records the sending time Ts of step 105 into the second storage unit 15 or 16 of the non-keyboard apparatus 10 or 10'.

Step 106: The computer 20 feeds back to the non-keyboard apparatus 10 or 10', at a feedback time Tf such as 10:00:00.050 (hour:minute:second.millisecond), that a first key corresponding to the first keycode is in an enabled status. Then, go on to steps 150 and 107. The first key is the Num Lock key and/or the Caps Lock key.

Step 150: The interface microcontroller 11 records the feedback time Tf of step 106 into the second storage unit 15 or 16 of the non-keyboard apparatus 10 or 10'.

Step 107: The sending time Ts recorded in step 140 and the feedback time Tf recorded in step 150 are read from the second storage unit 15 or 16 of the non-keyboard apparatus 10 or 10'. If the sending time Ts and the feedback time Tf cannot be read (i.e., there is no response from the second storage unit 15 or 16), go back to step 105. If the sending time Ts and the feedback time Tf are successfully read (i.e., the second storage unit 15 or 16 responds), go on to step 108.

Step 108: The time elapsed between the feedback time Tf and the sending time Ts is calculated to produce a computer efficiency parameter P, wherein the computer efficiency parameter P satisfies the relationship of: $P \geq (Tf-Ts)/2$. Following that, steps 160 and 109 are performed.

Step 160: The computer efficiency parameter P obtained from step 108 is recorded in the second storage unit 15 or 16 of the non-keyboard apparatus 10 or 10'.

Step 109: The interface microcontroller 11 reads the kind of operating system stored in step 130 from the second storage unit 15 or 16 of the non-keyboard apparatus 10 or 10', so as to determine a second keycode that matches the kind of operating system. The second keycode includes a plurality of key characters, or more particularly, includes a string of key characters that correspond to a plurality of keys. For example, in order for the Microsoft® Internet Explorer browser to open the web page WWW.USPTO.GOV, the second keycode includes keycodes corresponding to all the key characters in the string "WWW.USPTO.GOV", namely "W", "W", "W", ".", "U", "S", "P", "T", "O", ".", "G", "O", and "V". In addition, the interface microcontroller 11 reads the computer efficiency parameter P recorded in step 160 from the second storage unit 15 or 16 of the non-keyboard apparatus 10 or 10', so as to determine the time interval Ti at which keycodes corresponding to the key characters in the second keycode will be sent. Afterward, step 110 is executed. The second keycode is an ASCII code. Step 109 in the fourth preferred embodiment is different from step 109' in the second preferred embodiment in that step 109 reads the kind of operating system and the computer efficiency parameter P whereas step 109' only reads the kind of operating system.

Step 110: The non-keyboard apparatus 10 or 10' sends the second keycode to the computer 20 according to the time interval Ti based on the computer efficiency parameter P. Then, step 113 is performed. Step 110 in the fourth preferred embodiment is different from step 110' in the second preferred embodiment in that step 110 sends the second keycode to the computer according to the time interval Ti based on the computer efficiency parameter P whereas step 110' merely sends the second keycode to the computer, for the time interval for sending the key characters in the second keycode is not determined in the second preferred embodiment.

Figure 5:
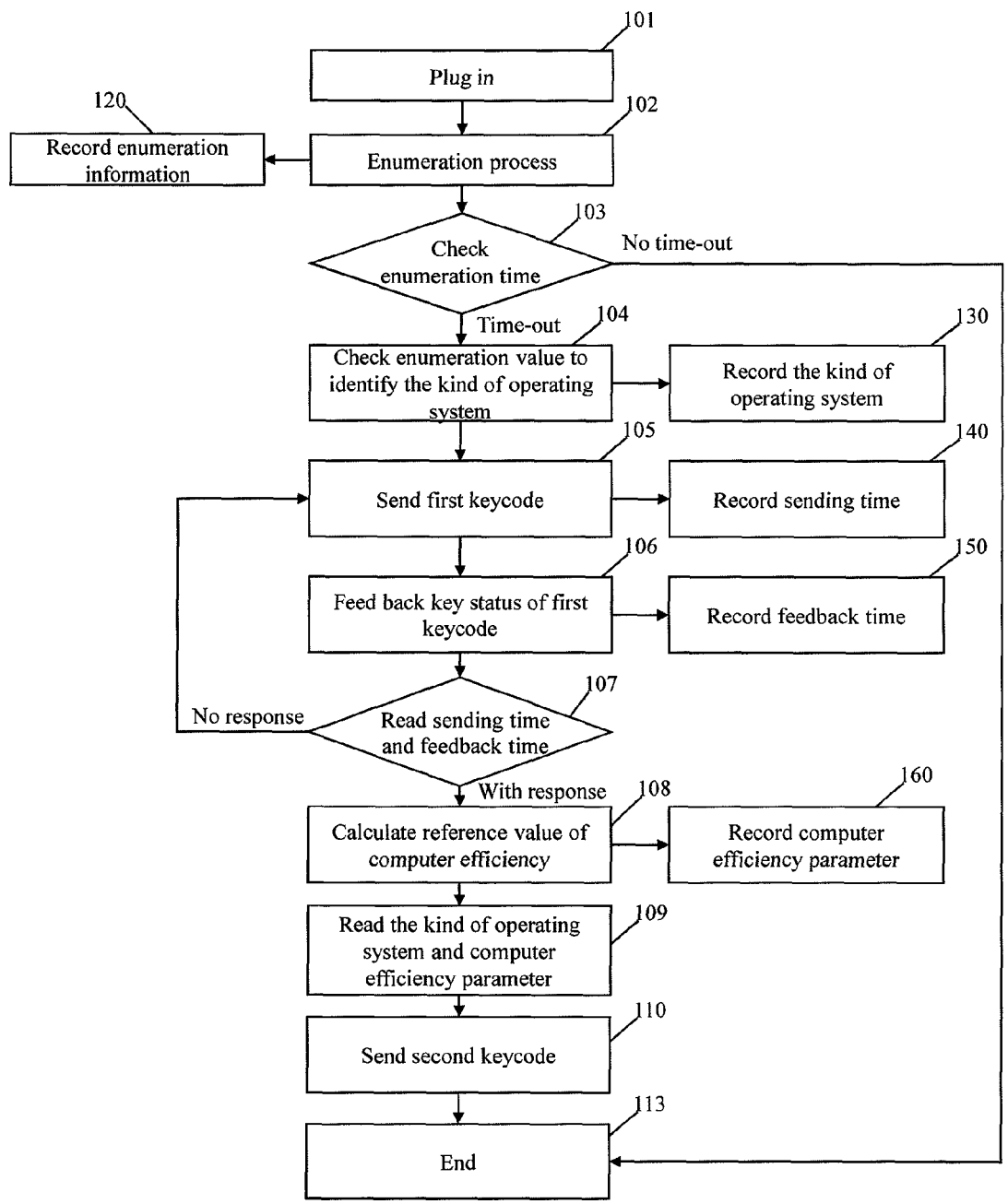
FIG. 5 is the flowchart of a method for sending a keycode of a non-keyboard apparatus according to the fifth preferred embodiment of the present invention.

The fifth preferred embodiment of the present invention is illustrated in FIG. 5, which shows another flowchart of the disclosed method for sending a keycode of a non-keyboard apparatus. The fifth preferred embodiment is different from the fourth in that the fifth preferred embodiment further checks the enumeration time. More specifically, step 103 in the first preferred embodiment is included between steps 102 and 104 in the fifth preferred embodiment so as for the interface microcontroller 11 to determine whether the non-keyboard apparatus 10 or 10' is connected to the computer 20 for the first time. The configuration of, and connections between, the components of the non-keyboard apparatus 10 or 10' and of the computer 20 in the fifth preferred embodiment are substantially the same as those in the first preferred embodiment as shown in FIG. 1B and FIG. 1C.

In step 103, the interface microcontroller 11 retrieves from the second storage unit 15 or 16 of the non-keyboard apparatus 10 or 10' the enumeration time in the enumeration information and the original recorded enumeration time and determines whether the enumeration time is greater than the original recorded enumeration time. If the enumeration time is greater than the original recorded enumeration time, which defines a time-out state, the interface microcontroller 11 determines that the non-keyboard apparatus 10 or 10' is connected to the computer 20 for the first time, and then step 104 is executed. If the enumeration time is not greater than (i.e., being less than or equal to) the original recorded enumeration time, which means no time-out, the interface microcontroller 11 determines that the non-keyboard apparatus 10 or 10' is not connected to the computer 20 for the first time, and then step 113 is executed to complete connection between the non-keyboard apparatus 10 or 10' and the computer 20.

Figure 6:
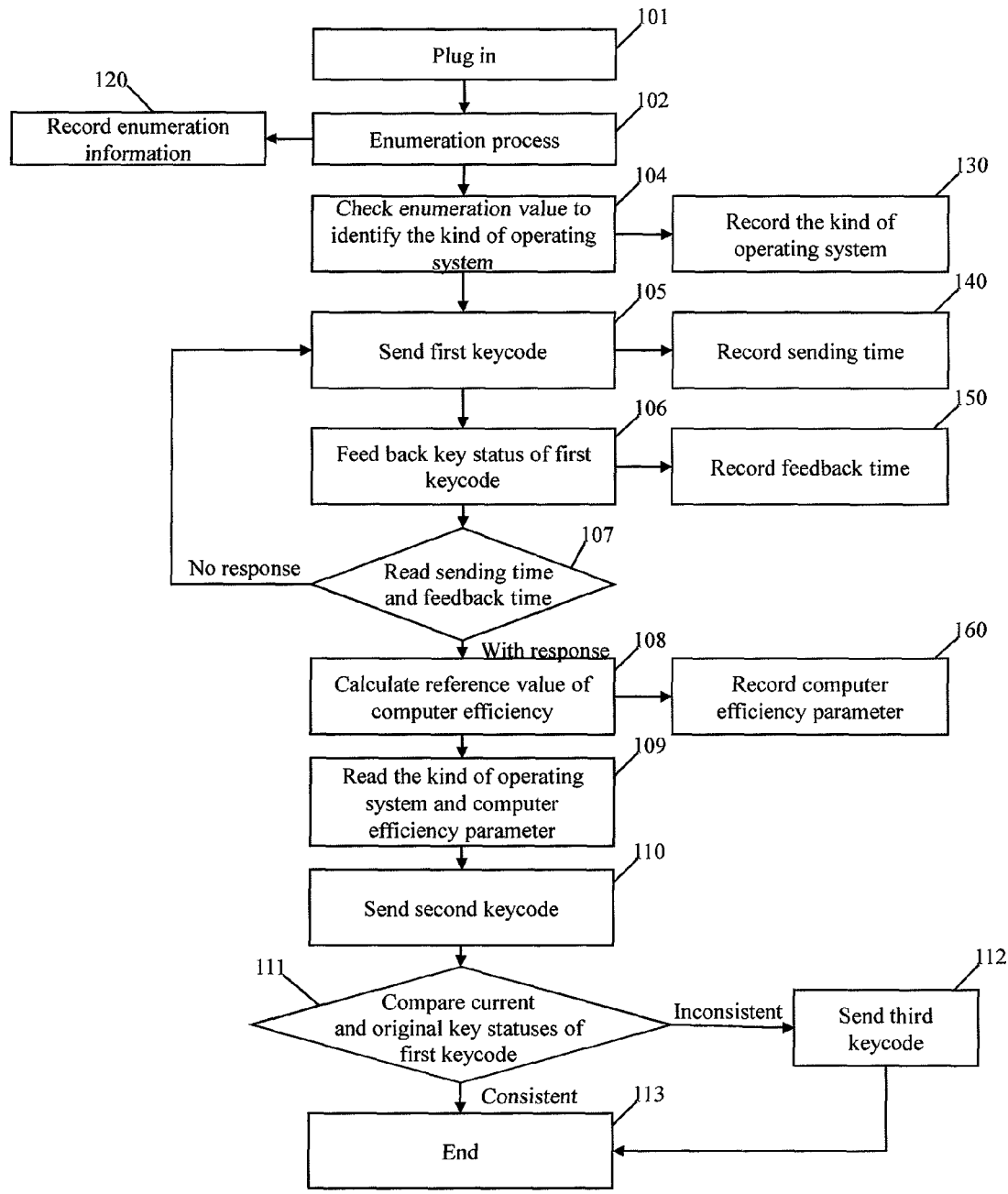
FIG. 6 is the flowchart of a method for sending a keycode of a non-keyboard apparatus according to the sixth preferred embodiment of the present invention.

FIG. 6 shows the flowchart of a method for sending a keycode of a non-keyboard apparatus according to the sixth preferred embodiment of the present invention. The sixth preferred embodiment is different from the fourth in that the sixth preferred embodiment further verifies if the first key is in the original key status. More specifically, steps 111 and 112 are carried out between steps 110 and 113 to restore the number keys or capital letter keys of a keyboard to the original key status detected in step 102. The configuration of, and connections between, the components of the non-keyboard apparatus 10 or 10' and of the computer 20 in the sixth preferred embodiment are substantially the same as those in the first preferred embodiment as shown in FIG. 1B and FIG. 1C.

In step 111, the non-keyboard apparatus 10 or 10' determines whether the current key status of the first key is consistent with the original key status of the first key as recorded in the second storage unit 15 or 16 in step 120. If yes, go on to step 113 to complete connection between the non-keyboard apparatus 10 or 10' and the computer 20; otherwise, go to step 112.

In step 112, the non-keyboard apparatus 10 or 10' sends a third keycode to the computer 20. Then, step 113 is executed. The third keycode is a keycode for disabling the Num Lock key and/or a keycode for disabling the Caps Lock key. The third keycode is intended to restore the number keys or capital letter keys of a keyboard to the original key status detected in step 102.

It can be known from the first to the sixth preferred embodiments that the disclosed method for sending a keycode of a non-keyboard apparatus includes, prior to sending a manufacturer- or user-predefined second keycode, identifying the kind of operating system in use by the computer, so as to prevent errors attributable to differences in operating systems and allow the non-keyboard apparatus to send out the predefined keycode successfully. This solves the problem of the conventional keyboards that they are not universally applicable to different operating systems.

Figure 7:
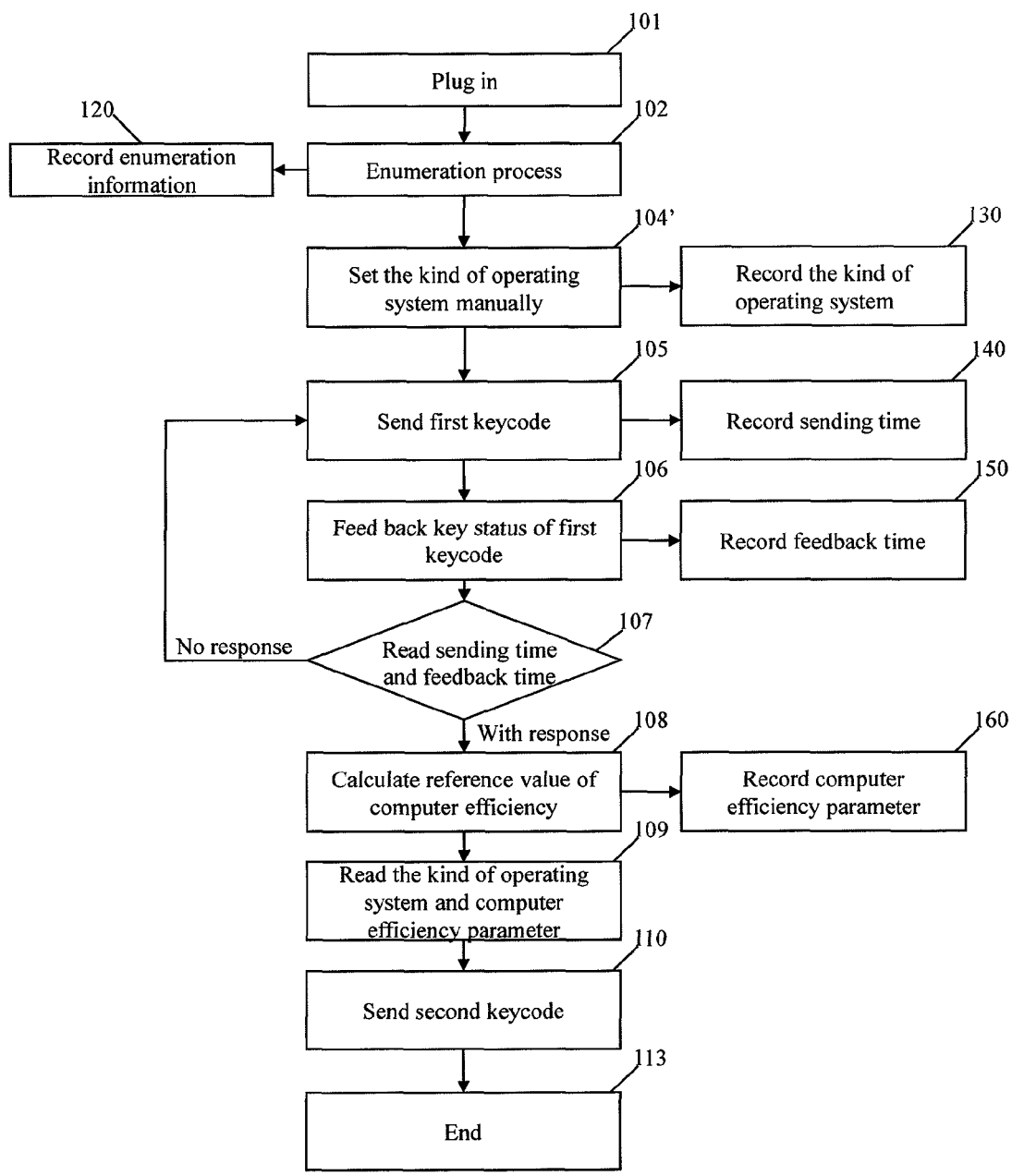
FIG. 7 is the flowchart of a method for sending a keycode of a non-keyboard apparatus according to the seventh preferred embodiment of the present invention.

FIG. 7 is the flowchart of a method for sending a keycode of a non-keyboard apparatus according to the seventh preferred embodiment of the present invention. The seventh preferred embodiment is different from the first in that the seventh preferred embodiment only performs the steps related to determining the computer efficiency parameter but does not perform the steps related to identifying the kind of the operating system in the computer 20 or restoring the first key to its original key status. The configuration of, and connections between, the components of the non-keyboard apparatus 10 or 10' and of the computer 20 in the seventh preferred embodiment are substantially the same as those in the first preferred embodiment as shown in FIG. 1B and FIG. 1C.

The method according to the seventh preferred embodiment includes the following steps:

Step 101: The non-keyboard apparatus 10 or 10' is electrically connected to the computer 20. Go on to step 102.

Step 102: A device enumeration process is performed between the non-keyboard apparatus 10 or 10' and the computer 20 to generate enumeration information. Then, move on to steps 120 and 104'. The enumeration information includes: a) an enumeration time defined as the time elapsed between the start and the end of the device enumeration process; b) an enumeration value defined as a value generated from the device enumeration process, or more particularly, from parameters involved in the device enumeration process; and c) the original key status of a first keycode. The device enumeration process on the part of the non-keyboard apparatus 10 or 10' is carried out by the interface microcontroller 11 after the USB interface 12 of the non-keyboard apparatus 10 or 10' is electrically connected to the serial bus interface 21 of the computer 20.

Step 120: The enumeration information generated in step 102 is recorded in the second storage unit 15 or 16 of the non-keyboard apparatus 10 or 10'. More specifically, the recorded enumeration information is stored in the second storage unit 15 of the non-keyboard apparatus 10 or the second storage unit 16 of the non-keyboard apparatus 10'. If the device enumeration process is performed upon first-time connection between the non-keyboard apparatus 10 or 10' and the computer 20, there is no previously stored enumeration information in the non-keyboard apparatus 10 or 10'. In that case, the enumeration time in the enumeration information is recorded and stored as the original recorded enumeration time.

Step 104': Information related to the kind of operating system in use is manually set by the user. Then, steps 130 and 105 are executed. Step 104' in the seventh preferred embodiment is different from step 104 in the first preferred embodiment in that, while the kind of operating system in use by the computer 20 is identified in step 104 of the first preferred embodiment by the interface microcontroller 11 according to the enumeration value stored in the second storage unit 15 or 16, step 104' in the seventh preferred embodiment allows the user to manually set information related to the kind of operating system in use.

Step 130: The interface microcontroller 11 records and stores the kind of operating system obtained from step 104' into the second storage unit 15 or 16 of the non-keyboard apparatus 10 or 10'.

Step 105: The non-keyboard apparatus 10 or 10' sends a first keycode to the computer 20 at a sending time Ts such as 10:00:00.000 (hour:minute:second.millisecond). Then, go on to steps 140 and 106. The first keycode is a keycode corresponding to the Num Lock key, a keycode corresponding to the Caps Lock key, or a keycode corresponding to both keys.

Step 140: The interface microcontroller 11 records the sending time Ts of step 105 into the second storage unit 15 or 16 of the non-keyboard apparatus 10 or 10'.

Step 106: The computer 20 feeds back to the non-keyboard apparatus 10 or 10', at a feedback time Tf such as 10:00:00.050 (hour:minute:second.millisecond), that a first key corresponding to the first keycode is in an enabled status. Then, move on to steps 150 and 107. The first key is the Num Lock key, the Caps Lock key, or both the Num Lock key and the Caps Lock key.

Step 150: The interface microcontroller 11 records the feedback time Tf of step 106 into the second storage unit 15 or 16 of the non-keyboard apparatus 10 or 10'.

Step 107: The sending time Ts recorded in step 140 and the feedback time Tf recorded in step 150 are read from the second storage unit 15 or 16 of the non-keyboard apparatus 10 or 10'. If the feeding time Ts and the feedback time Tf cannot be read (i.e., there is no response from the second storage unit 15 or 16), go back to step 105. If the sending time Ts and the feedback time Tf are successfully read (i.e., the second storage unit 15 or 16 responds), go on to step 108.

Step 108: The time elapsed between the feedback time Tf and the sending time Ts is calculated to produce a computer efficiency parameter P, wherein the computer efficiency parameter P satisfies the relationship of: $P \geq (Tf-Ts)/2$. Following that, steps 160 and 109 are performed.

Step 160: The computer efficiency parameter P obtained from step 108 is recorded in the second storage unit 15 or 16 of the non-keyboard apparatus 10 or 10'.

Step 109: The interface microcontroller 11 reads the kind of operating system stored in step 130 from the second storage unit 15 or 16 of the non-keyboard apparatus 10 or 10', so as to determine a second keycode that matches the kind of operating system. The second keycode includes a plurality of key characters, or more particularly, includes a string of key characters that correspond to a plurality of keys. For example, in order for the Microsoft® Internet Explorer browser to open the web page WWW.USPTO.GOV, the second keycode includes keycodes corresponding to all the key characters in the string "WWW.USPTO.GOV", namely "W", "W", "W", ".", "U", "S", "P", "T", "O", ".", "G", "O", and "V". In addition, the interface microcontroller 11 reads the computer efficiency parameter P recorded in step 160 from the second storage unit 15 or 16 of the non-keyboard apparatus 10 or 10', so as to determine the time interval Ti at which keycodes corresponding to the key characters in the second keycode will be sent. Afterward, step 110 is executed. The second keycode is an ASCII code.

Step 110: The non-keyboard apparatus 10 or 10' sends the second keycode to the computer 20 according to the time interval Ti based on the computer efficiency parameter P.

Step 113: The process ends, and connection between the non-keyboard apparatus 10 or 10' and the computer 20 is thus completed.

Figure 8:
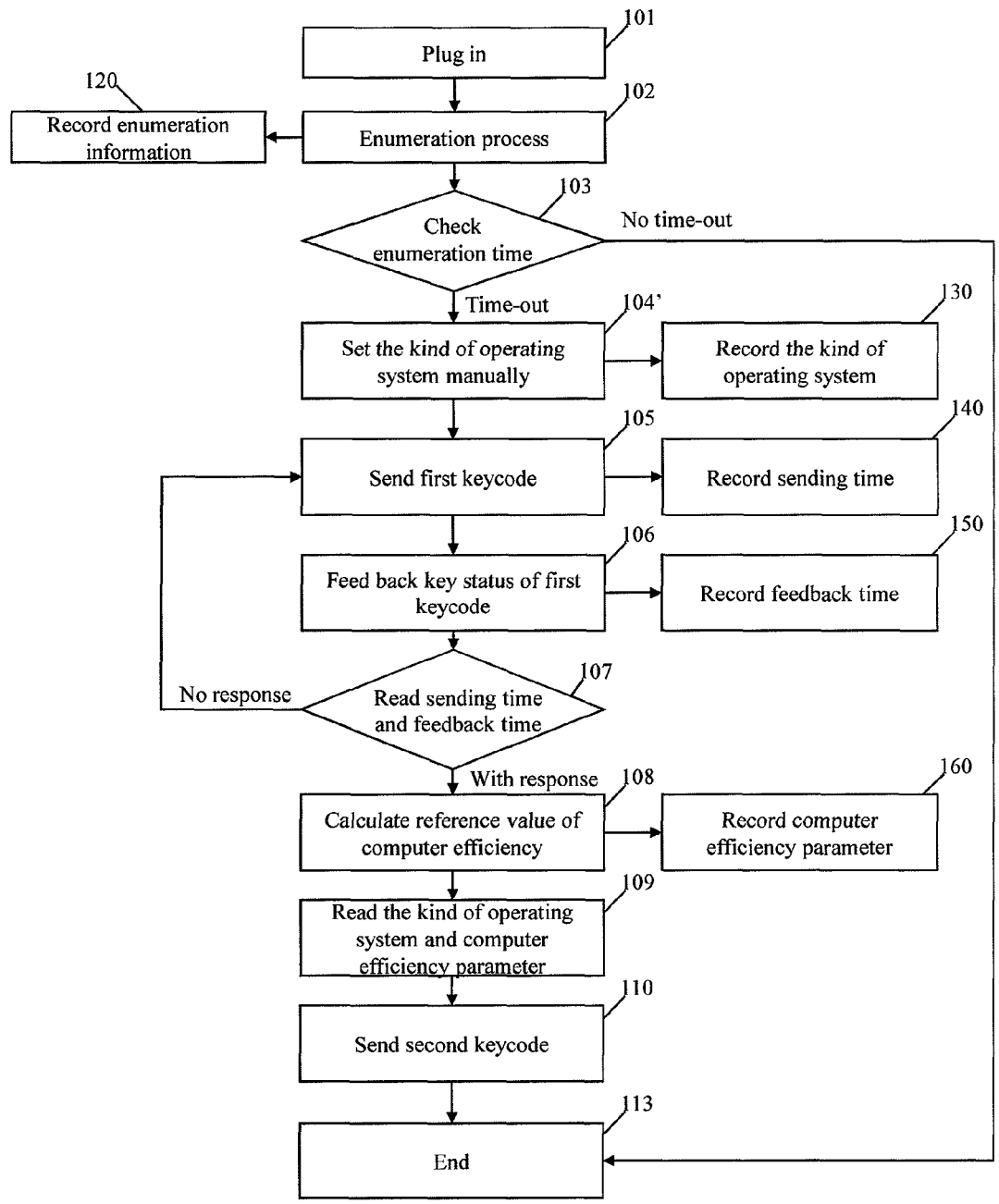
FIG. 8 is the flowchart of a method for sending a keycode of a non-keyboard apparatus according to the eighth preferred embodiment of the present invention.

The eighth preferred embodiment of the present invention is illustrated in FIG. 8, which shows another flowchart of the disclosed method for sending a keycode of a non-keyboard apparatus. The eighth preferred embodiment is different from the seventh preferred embodiment in that the former further checks the enumeration time, or more particularly, includes step 103 between steps 102 and 104', so as for the interface microcontroller 11 to determine whether the non-keyboard apparatus 10 or 10' is connected to the computer 20 for the first time. The configuration of, and connections between, the components of the non-keyboard apparatus 10 or 10' and of the computer 20 in the eighth preferred embodiment are substantially the same as those in the first preferred embodiment as shown in FIG. 1B and FIG. 1C.

In step 103, the interface microcontroller 11 retrieves from the second storage unit 15 or 16 of the non-keyboard apparatus 10 or 10' the enumeration time in the enumeration information and the original recorded enumeration time and determines whether the enumeration time is greater than the original recorded enumeration time. If the enumeration time is greater than the original recorded enumeration time, which defines a time-out state, the interface microcontroller 11 determines that the non-keyboard apparatus 10 or 10' is connected to the computer 20 for the first time, and then step 104' is executed. If the enumeration time is not greater than (i.e., being less than or equal to) the original recorded enumeration time, which means no time-out, the interface microcontroller 11 determines that the non-keyboard apparatus 10 or 10' is not connected to the computer 20 for the first time, and then step 113 is executed to complete connection between the non-keyboard apparatus 10 or 10' and the computer 20.

Figure 9:
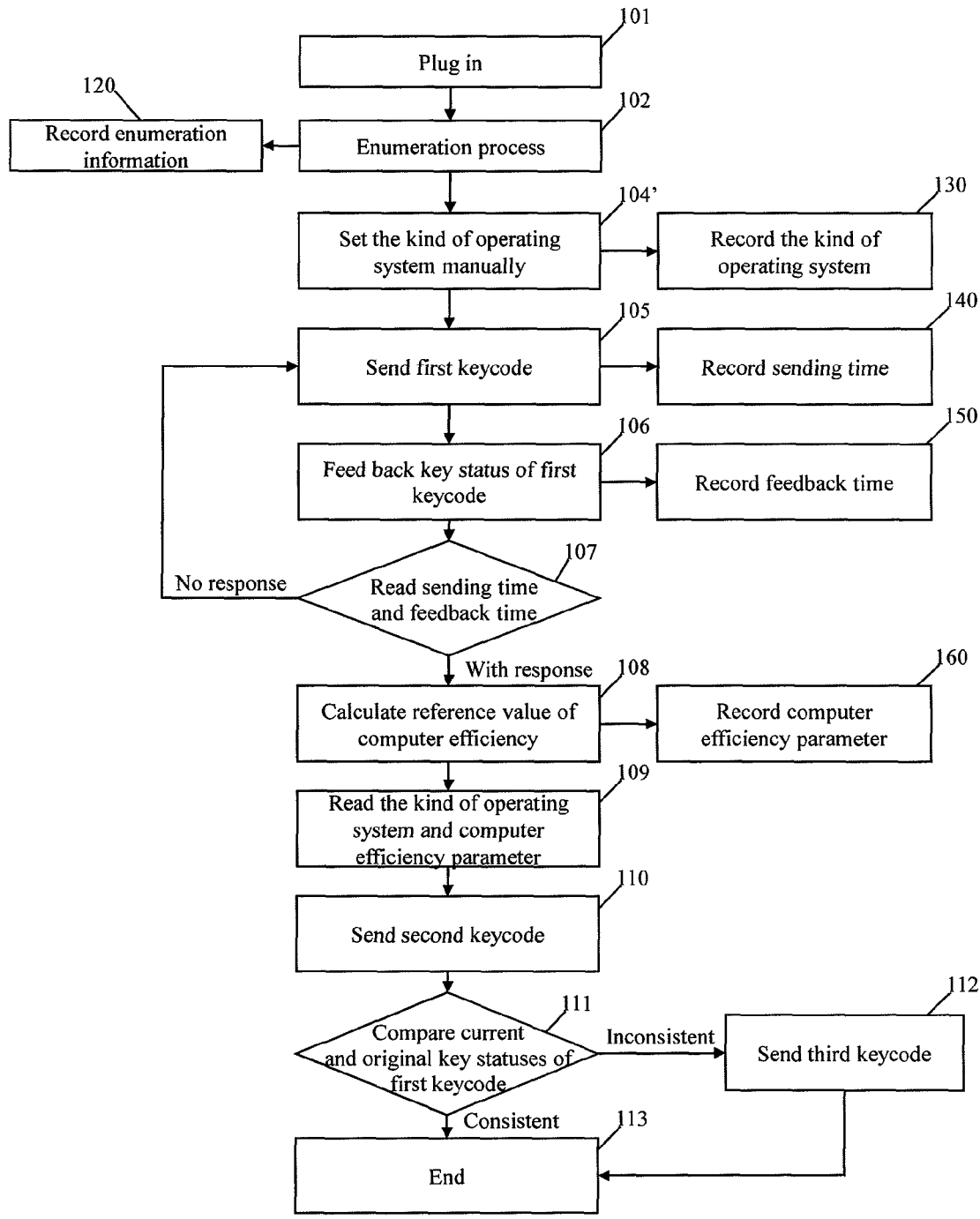
FIG. 9 is the flowchart of a method for sending a keycode of a non-keyboard apparatus according to the ninth preferred embodiment of the present invention.

The ninth preferred embodiment of the present invention is illustrated in FIG. 9, which shows another flowchart of the disclosed method for sending a keycode of a non-keyboard apparatus. The ninth preferred embodiment is different from the seventh preferred embodiment in that the former further determines whether the first key is in the original key status, or more particularly, includes steps 111 and 112 between steps 110 and 113, so as to restore the number keys or capital letter keys of a keyboard to the original key status detected in step 102. The configuration of, and connections between, the components of the non-keyboard apparatus 10 or 10' and of the computer 20 in the ninth preferred embodiment are substantially the same as those in the first preferred embodiment as shown in FIG. 1B and FIG. 1C.

In step 111, the non-keyboard apparatus 10 or 10' determines whether the current key status of the first key is consistent with the original key status of the first key as recorded in the second storage unit 15 or 16 in step 120. If yes, go on to step 113; otherwise, go to step 112.

In step 112, the non-keyboard apparatus 10 or 10' sends a third keycode to the computer 20. Then, step 113 is executed. The third keycode is a keycode for disabling the Num Lock key and/or a keycode for disabling the Caps Lock key. The third keycode is intended to restore the number keys or capital letter keys of a keyboard to the original key status detected in step 102.

Figure 10:
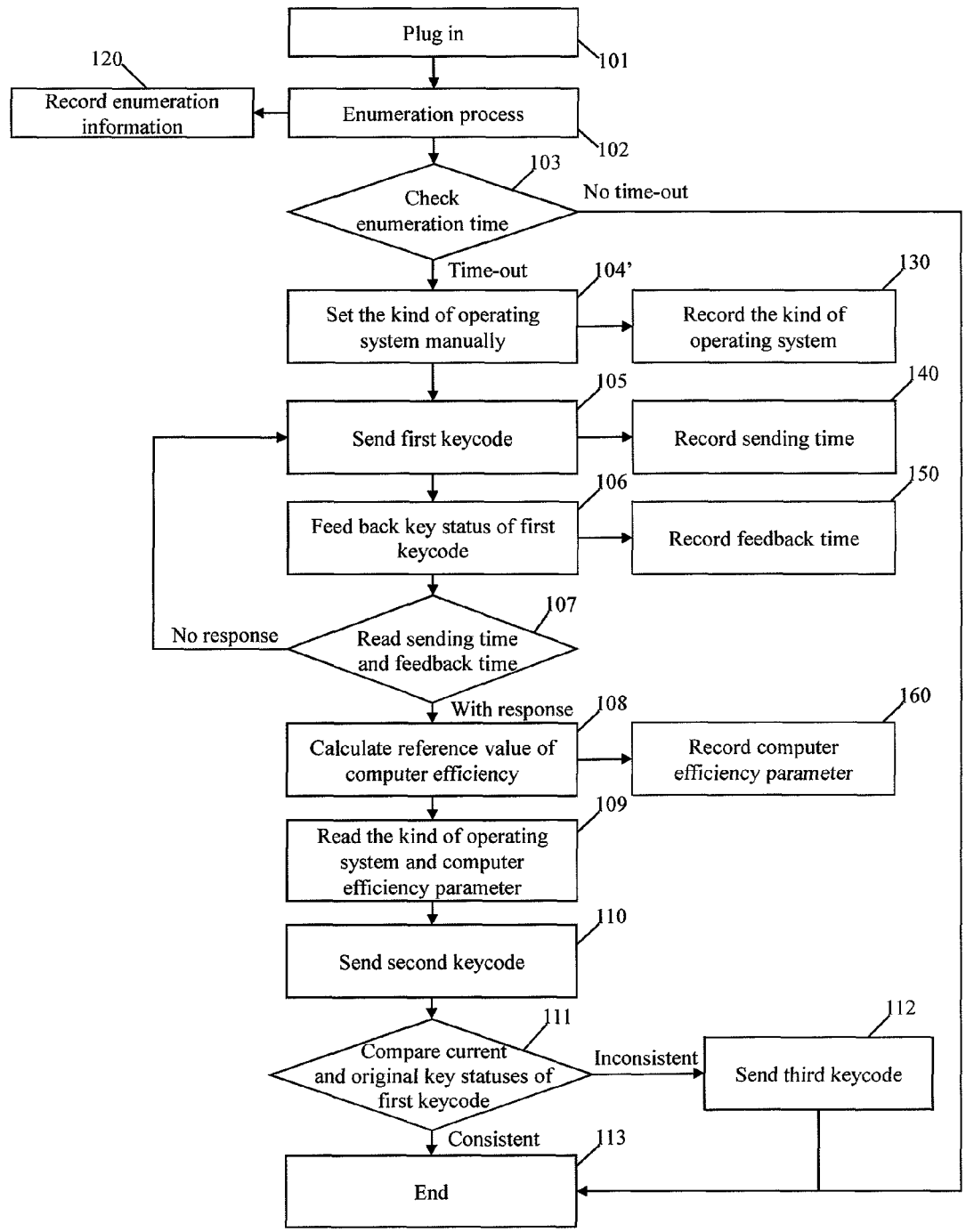
FIG. 10 is the flowchart of a method for sending a keycode of a non-keyboard apparatus according to the tenth preferred embodiment of the present invention.

The tenth preferred embodiment of the present invention is illustrated in FIG. 10, which shows another flowchart of the disclosed method for sending a keycode of a non-keyboard apparatus. The tenth preferred embodiment is different from the ninth preferred embodiment in that the former further checks the enumeration time. More specifically, step 103 of the first preferred embodiment is included between steps 102 and 104' of the tenth preferred embodiment, so as for the interface microcontroller 11 to determine whether the non-keyboard apparatus 10 or 10' is connected to the computer 20 for the first time. The configuration of, and connections between, the components of the non-keyboard apparatus 10 or 10' and of the computer 20 in the tenth preferred embodiment are substantially the same as those in the first preferred embodiment as shown in FIG. 1B and FIG. 1C.

In step 103, the interface microcontroller 11 retrieves from the second storage unit 15 or 16 of the non-keyboard apparatus 10 or 10' the enumeration time in the enumeration information and the original recorded enumeration time and determines whether the enumeration time is greater than the original recorded enumeration time. If the enumeration time is greater than the original recorded enumeration time, which defines a time-out state, the interface microcontroller 11 determines that the non-keyboard apparatus 10 or 10' is connected to the computer 20 for the first time, and then step 104' is executed. If the enumeration time is not greater than (i.e., being less than or equal to) the original recorded enumeration time, which means no time-out, the interface microcontroller 11 determines that the non-keyboard apparatus 10 or 10' is not connected to the computer 20 for the first time, and then step 113 is executed to complete connection between the non-keyboard apparatus 10 or 10' and the computer 20.

As demonstrated by the seventh to the tenth preferred embodiments, the disclosed method for sending a keycode of a non-keyboard apparatus checks the use state of the computer 20 by sending thereto a keycode corresponding to the Num Lock key or the Caps Lock key and waiting for the computer 20 to feed back that the Num Lock key or the Caps Lock key is enabled. Furthermore, only when the use state of the computer 20 is determined will the non-keyboard apparatus send out a user-predefined second keycode. Hence, errors such as a missing or lost keycode which may otherwise result from variation in computer efficiency are prevented, thereby solving the problem of the conventional keyboards that, due to their incapability of automatically adjusting the keycode sending speed in response to computer efficiency, errors such as missing or lost keycodes tend to occur.

While the present invention is described herein by reference to the preferred embodiments, it is understood that the preferred embodiments are not intended to limit the scope of the present invention. Moreover, as the contents disclosed herein should be readily understood and can be implemented by a person skilled in the art, all equivalent changes or modifications which do not depart from the spirit of the present invention should be encompassed by the appended claims.

What is claimed is:

1. A method for sending a keycode of a non-keyboard apparatus, comprising the steps of:
   (a) connecting the non-keyboard apparatus to a computer so as to perform device enumeration and generate enumeration information, wherein the enumeration information is recorded by the non-keyboard apparatus and includes an enumeration value;
   (b) identifying, according to the enumeration value, the kind of an operating system used by the computer, and recording the kind of the operating system by the non-keyboard apparatus; and
   (c) reading the kind of the operating system so as to determine a preset second keycode that matches the kind of the operating system, wherein the second keycode is an ASCII (American Standard Code for Information Interchange) code.

2. The method of claim 1, wherein the enumeration information further includes an enumeration time, and the method further comprises, between the steps (a) and (b), the step of: determining whether the enumeration time is greater than an original recorded enumeration time, wherein if the enumeration time is greater than the original recorded enumeration time, it is determined that the non-keyboard apparatus is connected to the computer for a first time, and the steps that follow, starting from the step (b), are executed; and if the enumeration time is not greater than the original recorded enumeration time, it is determined that the non-keyboard apparatus is not connected to the computer for the first time, and the steps that follow, starting from the step (b), are not executed.

3. The method of claim 1, further comprising, between the steps (b) and (c), the steps of:
   (I) sending a first keycode to the computer by the non-keyboard apparatus at a sending time, and recording the sending time by the non-keyboard apparatus, wherein the first keycode is selected from the group consisting of a keycode corresponding to the Num Lock key, a keycode corresponding to the Caps Lock key or a combination of two of these;
   (II) feeding back to the non-keyboard apparatus, by the computer at a feedback time, that a first key corresponding to the first keycode is enabled, and recording the feedback time by the non-keyboard apparatus; and
   (III) reading the sending time and the feedback time, and calculating a time elapsed therebetween so as to produce a computer efficiency parameter, wherein the computer efficiency parameter is recorded by the non-keyboard apparatus.

4. The method of claim 2, further comprising, between the steps (b) and (c), the steps of:
   (I) sending a first keycode to the computer by the non-keyboard apparatus at a sending time, and recording the sending time by the non-keyboard apparatus, wherein the first keycode is selected from the group consisting of a keycode corresponding to the Num Lock key, a keycode corresponding to the Caps Lock key or a combination of two of these;
   (II) feeding back to the non-keyboard apparatus, by the computer at a feedback time, that a first key corresponding to the first keycode is enabled, and recording the feedback time by the non-keyboard apparatus; and
   (III) reading the sending time and the feedback time, and calculating a time elapsed therebetween so as to produce a computer efficiency parameter, wherein the computer efficiency parameter is recorded by the non-keyboard apparatus.

5. The method of claim 3, wherein the step (c) further comprises: reading the computer efficiency parameter so as to determine a time interval at which key characters are to be sent.

6. The method of claim 4, wherein the step (c) further comprises: reading the computer efficiency parameter so as to determine a time interval at which key characters are to be sent.

7. The method of claim 5, wherein the enumeration information further includes an original key status of the first keycode, and the method further comprises, after the step (c), the step of: determining, by the non-keyboard apparatus, whether a current key status of the first keycode is consistent with the original key status of the first keycode, wherein if no, the non-keyboard apparatus sends a third keycode to the computer, wherein the third keycode is selected from the group consisting of a keycode for disabling the Num Lock key, a keycode for disabling the Caps Lock key or a combination of two of these.

8. The method of claim 6, wherein the enumeration information further includes an original key status of the first keycode, and the method further comprises, after the step (c), the step of: determining, by the non-keyboard apparatus, whether a current key status of the first keycode is consistent with the original key status of the first keycode, wherein if no, the non-keyboard apparatus sends a third keycode to the computer, wherein the third keycode is selected from the group consisting of a keycode for disabling the Num Lock key, a keycode for disabling the Caps Lock key or a combination of two of these.

9. The method of claim 3, wherein the computer efficiency parameter satisfies the relationship of: the computer efficiency parameter$\geq$(the feedback time−the sending time)/2.

10. The method of claim 4, wherein the computer efficiency parameter satisfies the relationship of: the computer efficiency parameter$\geq$(the feedback time−the sending time)/2.

11. A method for sending a keycode of a non-keyboard apparatus, comprising the steps of:
   (a) connecting the non-keyboard apparatus to a computer so as to perform device enumeration and generate enumeration information, wherein the enumeration information is recorded by the non-keyboard apparatus;
   (b) setting information related to the kind of an operating system, and recording the information by the non-keyboard apparatus;
   (c) sending a first keycode to the computer by the non-keyboard apparatus at a sending time, and recording the sending time by the non-keyboard apparatus, wherein the first keycode is selected from the group consisting of a keycode corresponding to the Num Lock key, a keycode corresponding to the Caps Lock key or a combination of two of these;
   (d) feeding back to the non-keyboard apparatus, by the computer at a feedback time, that a first key corresponding to the first keycode is enabled, and recording the feedback time by the non-keyboard apparatus;
   (e) reading the sending time and the feedback time, and calculating a time elapsed therebetween so as to produce a computer efficiency parameter, wherein the computer efficiency parameter is recorded by the non-keyboard apparatus; and
   (f) reading the kind of the operating system so as to determine a preset second keycode that matches the kind of the operating system, wherein the second keycode includes a plurality of key characters; and reading the computer efficiency parameter so as to determine a time interval at which the key characters are to be sent, wherein the second keycode is an ASCII (American Standard Code for Information Interchange) code.

12. The method of claim 11, wherein the enumeration information further includes an enumeration time, and the method further comprises, between the steps (a) and (b), the step of: determining whether the enumeration time is greater than an original recorded enumeration time, wherein if the enumeration time is greater than the original recorded enumeration time, it is determined that the non-keyboard apparatus is connected to the computer for a first time, and the steps that follow, starting from the step (b), are executed; and if the enumeration time is not greater than the original recorded enumeration time, it is determined that the non-keyboard apparatus is not connected to the computer for the first time, and the steps that follow, starting from the step (b), are not executed.

13. The method of claim 11, wherein the enumeration information further includes an original key status of the first keycode, and the method further comprises, after the step (f), the step of: determining, by the non-keyboard apparatus, whether a current key status of the first keycode is consistent with the original key status of the first keycode, wherein if no, the non-keyboard apparatus sends a third keycode to the computer, wherein the third keycode is selected from the group consisting of a keycode for disabling the Num Lock key, a keycode for disabling the Caps Lock key or a combination of two of these.

14. The method of claim 12, wherein the enumeration information further includes an original key status of the first keycode, and the method further comprises, after the step (f), the step of: determining, by the non-keyboard apparatus, whether a current key status of the first keycode is consistent with the original key status of the first keycode, wherein if no, the non-keyboard apparatus sends a third keycode to the computer, wherein the third keycode is selected from the group consisting of a keycode for disabling the Num Lock key, a keycode for disabling the Caps Lock key or a combination of two of these.

15. The method of claim 11, wherein the computer efficiency parameter satisfies the relationship of: the computer efficiency parameter$\geq$(the feedback time−the sending time)/2.

* * * * *